(12) United States Patent
Asada et al.

(10) Patent No.: US 12,381,178 B2
(45) Date of Patent: Aug. 5, 2025

(54) MANUFACTURING METHOD OF DISPLAY DEVICE AND HOLDING SUBSTRATE

(71) Applicant: Japan Display Inc., Tokyo (JP)

(72) Inventors: Keisuke Asada, Tokyo (JP); Kazuyuki Yamada, Tokyo (JP); Kenichi Takemasa, Tokyo (JP); Daiki Isono, Tokyo (JP)

(73) Assignee: Japan Display Inc., Tokyo (JP)

( * ) Notice: Subject to any disclaimer, the term of this patent is extended or adjusted under 35 U.S.C. 154(b) by 484 days.

(21) Appl. No.: 17/746,263

(22) Filed: May 17, 2022

(65) Prior Publication Data

US 2022/0375895 A1   Nov. 24, 2022

(30) Foreign Application Priority Data

May 19, 2021 (JP) ................................ 2021-084730

(51) Int. Cl.
*H01L 23/00* (2006.01)
*H01L 25/16* (2023.01)
*H10H 20/01* (2025.01)

(52) U.S. Cl.
CPC ............ *H01L 24/95* (2013.01); *H01L 25/167* (2013.01); *H10H 20/018* (2025.01); *H01L 24/81* (2013.01);
(Continued)

(58) Field of Classification Search
CPC ... H01L 24/95; H01L 33/0093; H01L 25/167; H01L 24/81; H01L 24/83;
(Continued)

(56) References Cited

U.S. PATENT DOCUMENTS

2002/0098257 A1   7/2002   Ikeda et al.
2020/0013662 A1*  1/2020   Chaji .................. H01L 21/6835
(Continued)

FOREIGN PATENT DOCUMENTS

JP   2002-214414 A   7/2002
JP   2012-109428 A   6/2012
(Continued)

OTHER PUBLICATIONS

Office Action issued in related Japanese Patent Application No. 2021-084730, mailed on Oct. 29, 2024 and English translation of same. 6 pages.

*Primary Examiner* — Zandra V Smith
*Assistant Examiner* — Andre C Stevenson
(74) *Attorney, Agent, or Firm* — K&L Gates LLP

(57) ABSTRACT

According to an aspect, a manufacturing method of a display device includes: obtaining a first reference position on a surface of a holding substrate based on positions of a plurality of first alignment marks of the holding substrate; and aligning the holding substrate with a transfer destination substrate such that the first reference position on the holding substrate and a second reference position on a surface of the transfer destination substrate coincide. The holding substrate is sectioned into a plurality of first sections and a plurality of second sections when viewed from one direction. Each of the first sections is provided in a part of a gap between the second sections when viewed from the one direction, has a light transmission rate higher than a light transmission rate of the second sections, and forms the first alignment mark through which light passes when viewed from the one direction.

7 Claims, 10 Drawing Sheets

(52) U.S. Cl.
CPC ..... *H01L 24/83* (2013.01); *H01L 2224/81123* (2013.01); *H01L 2224/8113* (2013.01); *H01L 2224/81224* (2013.01); *H01L 2224/81801* (2013.01); *H01L 2224/83123* (2013.01); *H01L 2224/8313* (2013.01); *H01L 2224/83224* (2013.01); *H01L 2224/83801* (2013.01); *H01L 2224/95001* (2013.01); *H01L 2224/95121* (2013.01)

(58) Field of Classification Search
CPC ... H01L 2224/81123; H01L 2224/8113; H01L 2224/81224; H01L 2224/81801; H01L 2224/83123; H01L 2224/8313; H01L 2224/83224; H01L 2224/83801; H01L 2224/95001; H01L 2224/95121
See application file for complete search history.

(56) References Cited

U.S. PATENT DOCUMENTS

| | | | |
|---|---|---|---|
| 2021/0375780 A1* | 12/2021 | Huang | H01L 23/544 |
| 2022/0102326 A1 | 3/2022 | Asada | |
| 2022/0216087 A1* | 7/2022 | Van Den Brand | C09J 7/35 |

FOREIGN PATENT DOCUMENTS

| | | | |
|---|---|---|---|
| JP | 2020-017580 A | 1/2020 | |
| JP | 2021004988 A | 1/2021 | |

* cited by examiner

MANUFACTURING METHOD OF DISPLAY DEVICE AND HOLDING SUBSTRATE

CROSS-REFERENCE TO RELATED APPLICATION

This application claims the benefit of priority from Japanese Patent Application No. 2021-084730 filed on May 19, 2021, the entire contents of which are incorporated herein by reference.

BACKGROUND

1. Technical Field

What is disclosed herein relates to a manufacturing method of a display device and a holding substrate.

2. Description of the Related Art

There are display devices that include pixels formed by combining red, green, and blue light-emitting elements, for example. The light-emitting elements for forming the pixels are transferred from a holding substrate that holds the light-emitting elements to a transfer destination substrate in the display device. In manufacturing process of such a display device, a technique may be used in which multiple light-emitting elements are transferred by one operation, by pressing the holding substrate holding the light-emitting elements directly onto the transfer destination substrate.

In transferring the light-emitting elements by pressing the holding substrate holding the light-emitting elements directly onto the transfer destination substrate, alignment is performed between the holding substrate and the transfer destination substrate. The alignment between the holding substrate and the transfer destination substrate is performed by aligning alignment marks provided on the holding substrate with alignment marks provided on the transfer destination substrate.

Japanese Patent Application Laid-open Publication No. 2021-4988 discloses that alignment marks for alignment between an anisotropic conductive film having conductive particles dispersed and a circuit board are formed on the anisotropic conductive film by aggregating the conductive particles.

The alignment marks are provided on the holding substrate by forming a partial region in which no light-emitting elements are held in a region of the holding substrate in which the light-emitting elements are to be held and by forming the alignment marks in the partial region. Thus, the quantity of light-emitting elements per holding substrate is reduced by the partial region in which the alignment marks are provided. Furthermore, in the manufacturing process of the display device, after the light-emitting elements are transferred from the holding substrate to the transfer destination substrate by one operation, a process is required for transferring the light-emitting elements to a region in the transfer destination substrate corresponding to the partial region of the holding substrate provided with the alignment marks.

For the foregoing reasons, there is a need for a manufacturing method of a display device and a holding substrate that can increase the quantity of the light-emitting elements per holding substrate.

SUMMARY

According to an aspect, a manufacturing method of a display device includes: obtaining a first reference position on a surface of a holding substrate based on positions of a plurality of first alignment marks of the holding substrate; and aligning the holding substrate with a transfer destination substrate such that the first reference position on the holding substrate and a second reference position on a surface of the transfer destination substrate coincide. The holding substrate is sectioned into a plurality of first sections and a plurality of second sections when viewed from one direction. Each of the first sections is provided in a part of a gap between the second sections when viewed from the one direction, has a light transmission rate higher than a light transmission rate of the second sections, and forms the first alignment mark through which light passes when viewed from the one direction.

According to an aspect, a holding substrate includes a plurality of first sections and a plurality of second sections, the first sections and the second sections being sectioned when viewed from one direction. The second sections are arranged at predetermined intervals when viewed from the one direction. Each of the first sections is provided in a part of a gap between the second sections when viewed from the one direction. The first section has a light transmission rate higher than a light transmission rate of the second sections and forms a first alignment mark through which light passes when viewed from the one direction.

DETAILED DESCRIPTION

The following describes an embodiment of the disclosure in detail with reference to the accompanying drawings. What is disclosed herein is not limited by what is described in the following embodiment. The constituent elements described below include those that can be readily assumed by those skilled in the art and those that are substantially the same. Furthermore, the constituent elements described below can be combined as appropriate. What is disclosed herein is only an example, and any modification that can be easily conceived by those skilled in the art, while maintaining the main purpose of the disclosure, is naturally included in the scope of the disclosure. To explain the drawings clearer, the widths, thicknesses, and shapes of respective components may be more schematically illustrated than the actual ones. Those are illustrated by way of examples and do not limit the interpretation of the disclosure. In the present specification and the respective drawings, the same elements already described in the previous drawings are labeled with the same symbols and detailed description thereof may be omitted as appropriate.

Figure 1:
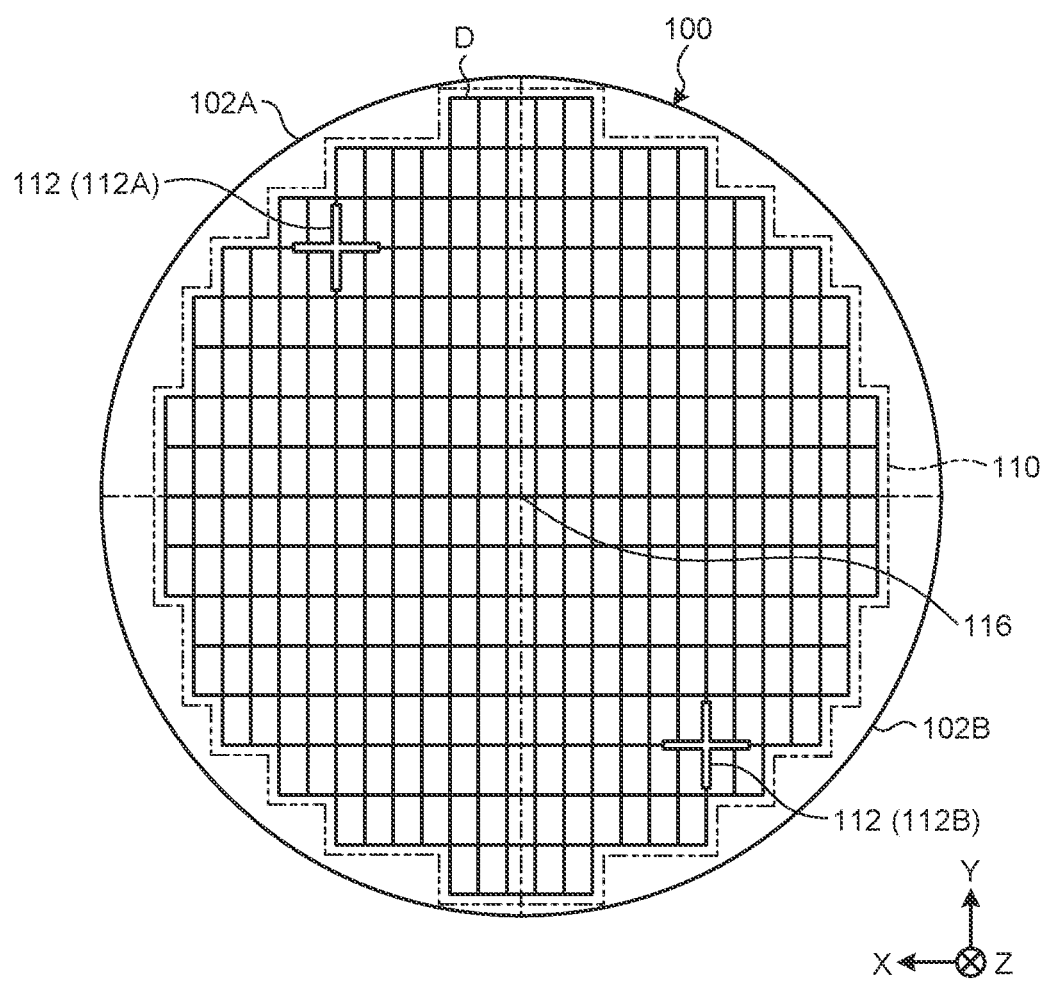
FIG. 1 is a conceptual bottom view of a holding substrate according to an embodiment.
Figure 2:
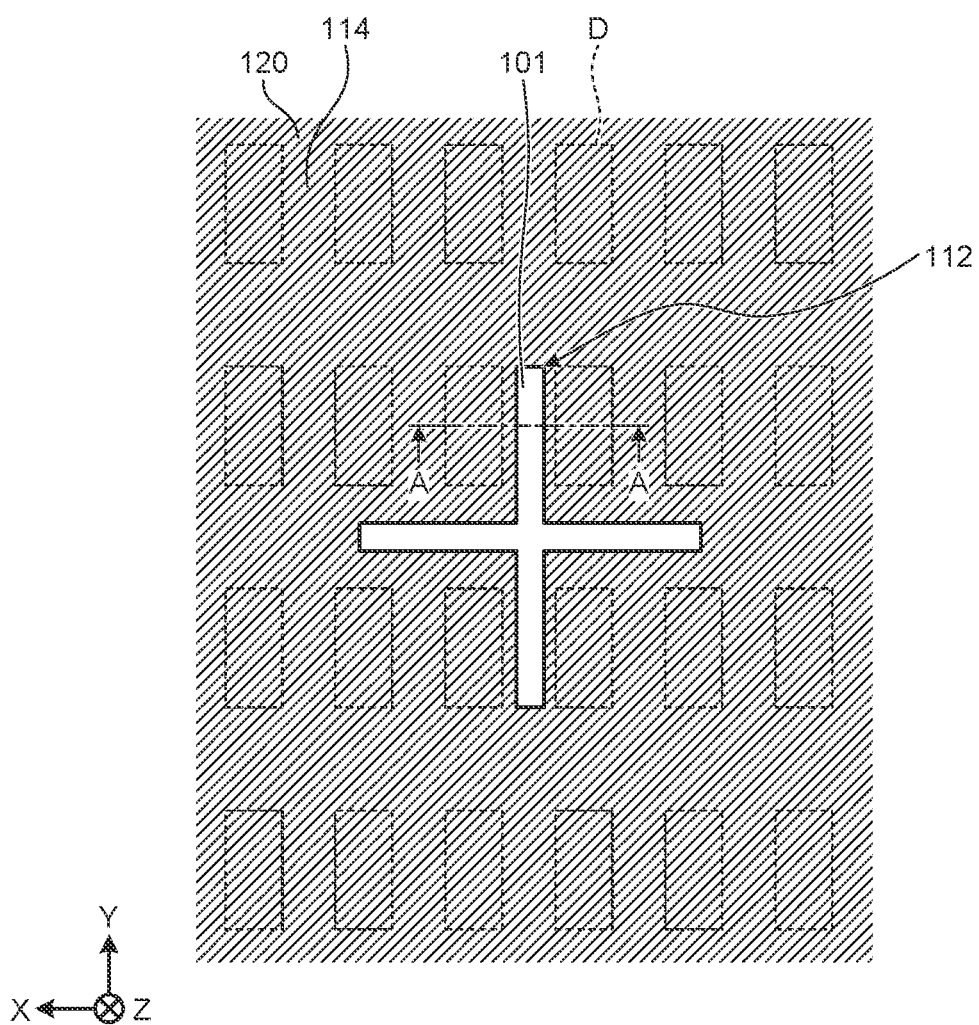
FIG. 2 is a detailed view of a main portion of FIG. 1.
Figure 3A:
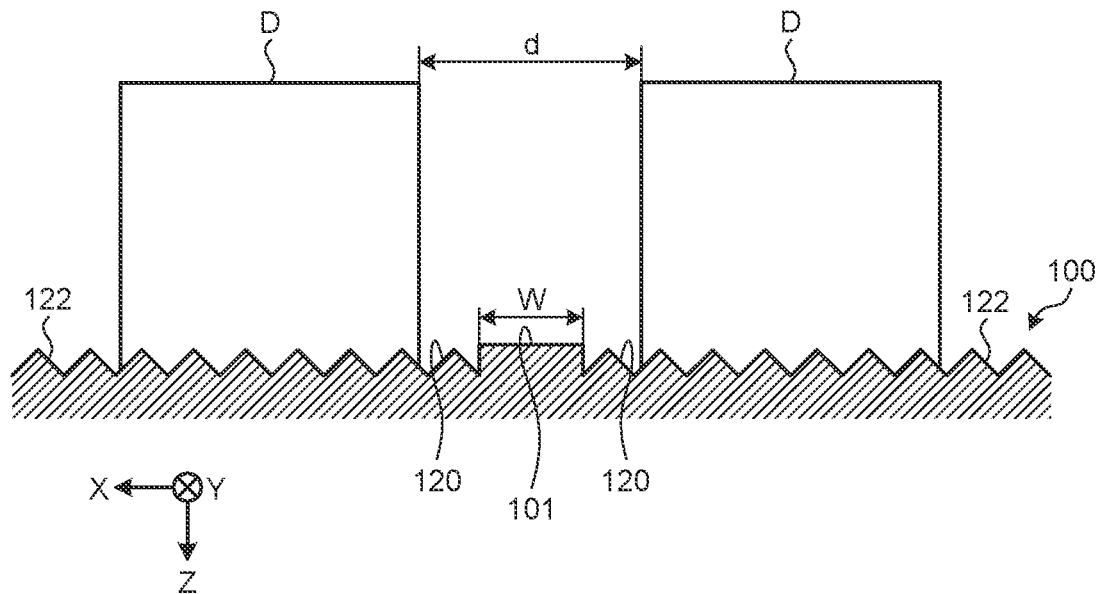
FIG. 3A is a cross-sectional view taken along line A-A in FIG. 2.
Figure 3B:
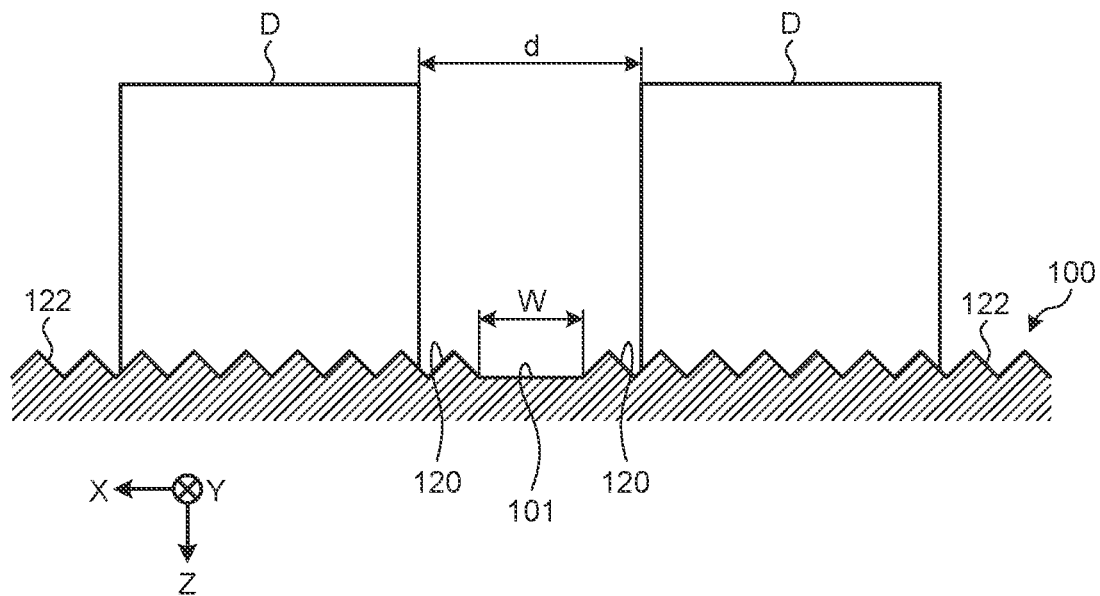
FIG. 3B is a cross-sectional view of a modification of FIG. 3A.
Figure 4:
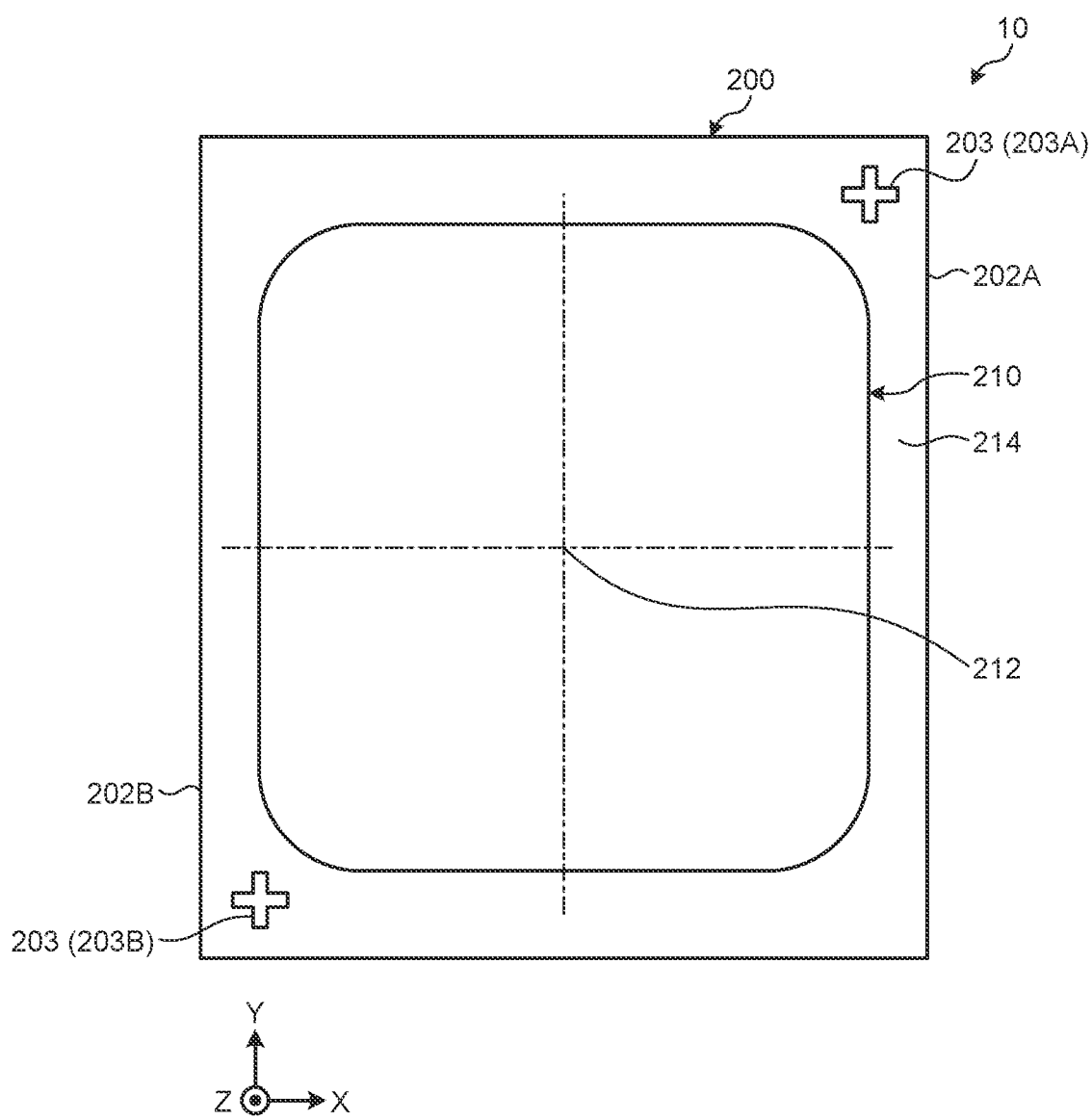
FIG. 4 is a conceptual plan view of a transfer destination substrate.

The embodiment of the disclosure is described below with reference to FIGS. 1 to 4. FIG. 1 is a conceptual bottom view of a holding substrate according to the embodiment. FIG. 2 is a detailed view of a main portion of FIG. 1. FIG. 3A is a cross-sectional view taken along line A-A in FIG. 2. FIG. 3B is a cross-sectional view of a modification of FIG. 3A. FIG. 4 is a conceptual plan view of a transfer destination substrate.

In the following description, the surface of a first region 110 of a holding substrate 100 is defined as an XY plane parallel to X and Y axes, and the axis orthogonal to the XY plane is defined as a Z axis. The direction that is parallel to the X axis and extends from right to left in FIG. 1 may be referred to as a +X direction, and the direction opposite to the +X direction may be referred to as a −X direction. The direction that is parallel to the Y axis and extends from bottom to top in FIG. 1 may be referred to as a +Y direction, and the direction opposite to the +Y direction may be referred to as a −Y direction. The direction that is parallel to the Z axis and extends toward the paper surface in FIG. 1 may be referred to as a +Z direction, and the direction opposite to the +Z direction is referred to as −Z direction.

First Embodiment

A plurality of light-emitting elements D held on the holding substrate 100 illustrated in FIG. 1 are transferred to a transfer destination substrate 200 (refer to FIG. 4).

Light-Emitting Element

The light-emitting elements D emit light in predetermined colors. The light-emitting element D is an inorganic light-emitting diode (LED) chip having a size of approximately 3 μm to 300 μm, when viewed orthogonally to a first surface 101, and is called a micro LED. A display device 10 provided with pixels having the micro LED is also called a micro LED display device. The prefix "micro" of micro LED does not limit the size of the inorganic light-emitting diode. The light-emitting element D may be a mini LED.

The light-emitting element D has a layered structure in which a first electrode connection layer, a light-emitting layer, and a second electrode connection layer, which are not illustrated, are layered in this order. The layered structure of the light-emitting element D is formed by growing a semiconductor crystal on a growth substrate. When the light-emitting layer is a gallium nitride (GaN) material, the first electrode connection layer is N-type GaN and the second electrode connection layer is P-type GaN, for example. The first and second electrode connection layers of the light-emitting element D are energized, resulting in the light-emitting layer emitting light in a predetermined color. The light emitted by the light-emitting element D can be in any color, such as red, blue, lime green, or green. Specifically, the central wavelength of each color of light emitted from the light-emitting element D is approximately 610 nm for red, approximately 470 nm for blue, approximately 505 nm for green, or approximately 570 nm for lime green.

Holding Substrate

The holding substrate 100 is a plate-like substrate. As illustrated in FIG. 1, the holding substrate 100 has a first region 110 at the center of the holding substrate 100, an edge 102A, which is the outer edge of the holding substrate 100, and an edge 102B, which is the outer edge of the holding substrate 100, on the opposite side to the edge 102A with the first region 110 interposed therebetween. The holding substrate 100 is made of a material having a light transmission property. The holding substrate 100 is what is called a growth substrate for growing a semiconductor thin film crystal. The holding substrate 100 is a sapphire substrate, for example. The holding substrate 100 is what is called a patterned sapphire substrate. A plurality of protrusions 122 are formed in a pattern on a second surface 120 of the holding substrate.

The holding substrate 100 is not limited to a growth substrate, but may also be a transfer substrate that temporarily holds the light-emitting elements D for transfer. In this case, the holding substrate 100 is made of a plate material such as a glass-based material or a resin-based material, and holds the light-emitting elements D on the second surface 120 via an adhesive sheet, for example. The holding substrate 100 is described below as a growth substrate.

First Region

As illustrated in FIGS. 1 and 2, the first region 110 is provided with a plurality of first sections 112 and a plurality of second sections 114. In the embodiment, the center 116 of the first region 110 coincides with the position of the center of the holding substrate 100 when viewed from the +Z direction.

First Section

As illustrated in FIGS. 2, 3A, and 3B, the first section 112 has the first surface 101 that is flat and parallel to the XY plane. As illustrated in FIG. 2, the first section 112 is provided in a part of a gap between the second sections 114 when viewed from the +Z direction. The first section 112 is provided in a part of the grid lines formed by the gaps between the second sections 114. As illustrated in FIG. 2, the first section 112 has a cruciform shape when viewed from the +Z direction. As illustrated in FIGS. 3A and 3B, the width w in the +X direction, along the first surface 101, of the first section 112 provided in the gap between the second sections 114 is smaller than the distance d between the second sections 114. The shape of the first section 112 viewed from the +Z direction may be a shape that is a combination of two straight lines, for example.

As illustrated in FIGS. 3A and 3B, the height difference of asperities on the first surface 101 of the first section 112 is smaller than that of the second surface 120 of the second section 114. The first surface 101 of the first section 112 is a smooth surface, for example. In FIG. 3A, the first surface 101 is a smooth surface at a higher position in the Z direction from the second surface 120. In FIG. 3B, the first surface 101 is a smooth surface at a lower position in the Z direction from the second surface 120. The height difference of the asperities of the first surface 101 is smaller than that of the second surface 120. This causes the first section 112 to have a light transmission rate higher than that of the second section 114. The first section 112 transmits light having a predetermined light amount between the first surface 101 and a surface opposite to the first surface 101.

As illustrated in FIG. 1, the first sections 112 are provided in the first region 110. The first sections 112 are provided at positions point-symmetrically about the center 116 of the first region 110. For example, when the first sections 112 include a first section 112A and a first section 112B, the first section 112A is provided adjacent to the edge 102A that is located in the +X and +Y directions when viewed from the center 116 of the first region 110, and the first section 112B is provided adjacent to the edge 102B that is located in the −X and −Y directions when viewed from the center 116 and opposite to the edge 102A with the first region 110 therebetween. As illustrated in FIG. 2, the first section 112 is surrounded by the second sections 114. When the holding substrate 100 is provided with light-emitting elements D on the second surface 120 of the second section 114, the first section 112 is provided across a plurality of gaps formed by a plurality of the light-emitting elements D.

Second Section

As illustrated in FIGS. 2, 3A, and 3B, the second sections 114 have the second surface 120 when viewed from the +Z direction. The second sections 114 are arranged at predetermined intervals when viewed from the +Z direction. As illustrated in FIG. 1, the second sections 114 are arranged in a grid pattern when viewed from the +Z direction. As illustrated in FIGS. 3A and 3B, the second surface 120 has the protrusions 122, and the height difference in asperities of the protrusions 122 is larger than that of the first surface 101. The second surface 120 has a light transmission rate lower than that of the first surface 101 because the asperities of the protrusions 122 reflect light that is incident on the second surface 120.

The protrusions 122 of the second surface 120 are formed of light-reflecting structures that are periodically formed as a fine pattern. The light-reflecting structure has a shape such as a cone, a hemisphere, a pyramid, or a column protruding in the orthogonal direction of the second surface 120, for example.

The protrusions 122 of the second surface 120 can be formed by the same process as that used to form a patterned sapphire substrate (PPS), for example. The protrusions 122 of the second surface 120 can be formed, for example, by an etching process technique or what is called a nanoimprinting technique.

The following describes a case where the protrusions 122 of the second surface 120 in FIG. 3A are formed by a dry etching process. The surface of the first region 110 of the holding substrate before the dry etching process may be a smooth surface or a surface with a pattern of pre-formed asperities. When the holding substrate 100 having the first region 110 with a smooth surface before the dry etching process is used, the first sections 112 are covered with a photoresist and the second sections 114 are not covered with the photoresist. In this case, the first sections 112 are not dry-etched and remain as a smooth surface, while the second surface 120 of the second sections 114 are dry-etched to form the pattern of the protrusions 122.

In FIG. 3B, when the holding substrate having the first region 110 with a pattern of the protrusions 122 formed on the surface thereof is used, the first sections 112 are not covered with a photoresist and the second sections 114 are covered with the photoresist. In this case, the first sections 112 are dry-etched and the first surfaces 101 become a smooth surface, while the second surface 120 of the second sections 114 is not dry-etched and remains as the pattern of the protrusions 122. In this way, the protrusions 122 on the second surface 120 are formed by the dry etching process. A mask used for the dry etching process can be formed as follows, for example. A photoresist is applied to the entire surface of the first region 110 of the holding substrate 100 to form a photoresist film. Thereafter, regions of the photoresist film corresponding to either the first sections 112 or the second sections 114 are exposed to light by lithography to form the mask.

Transfer Destination Substrate

As illustrated in FIG. 4, the transfer destination substrate 200 is a plate-like substrate. The transfer destination substrate 200 functions as an array substrate of the display device 10, for example. The light-emitting elements D are transferred to a transfer destination region 210 of the transfer destination substrate 200. As a result, the transfer destination region 210 functions as a display region. As illustrated in FIG. 4, the transfer destination substrate 200 has the transfer destination region 210, a peripheral region 214, and a plurality of second alignment marks 203. The transfer destination substrate 200 is, for example, an array substrate in which thin film transistor (TFT) circuits, signal lines, and scanning lines are formed in the display region.

The transfer destination region 210 is provided with a plurality of pixels to form the display region. The light-emitting elements D are transferred to predetermined positions in the transfer destination region 210. The transfer destination region 210 has the same size as the first region 110 of the holding substrate 100 when viewed from the +Z direction. The transfer destination region 210 may include other light-emitting elements transferred prior to the transfer of the light-emitting elements D. The peripheral region 214 is provided around the outer periphery of the transfer destination region 210.

As illustrated in FIG. 4, the second alignment marks 203 are provided on a surface that is visible together with the surface of the transfer destination region 210 when the transfer destination substrate 200 is viewed from the +Z direction. The second alignment marks 203 are provided at positions point-symmetrically about the center 212 of the transfer destination region 210. The second alignment marks 203 are provided in the peripheral region 214, for example. The second alignment marks 203 is not limited to being provided in the peripheral region 214, but may be provided in the transfer destination region 210. In this case, the second alignment marks 203 are provided at positions corresponding to a plurality of first alignment marks 103 on the holding substrate 100.

As illustrated in FIG. 4, a second alignment mark 203A is provided, in the peripheral region 214, in the +X and +Y directions when viewed from the center 212 of the transfer destination region 210, while a second alignment mark 203B is provided, in the peripheral region 214, on a line connecting the second alignment mark 203B and the center 212 of the transfer destination region 210 in the −X direction and −Y direction when viewed from the center 212 of the transfer destination region 210, for example. In other words, the second alignment marks 203A and 203B are provided, in the peripheral region 214 of the transfer destination substrate 200, at positions diagonal with respect to the center 212 of the transfer destination region 210 with the transfer destination region 210 interposed therebetween. The second alignment marks 203A and 203B are not limited to being provided at the diagonal positions with the transfer destination region 210 therebetween. They may be provided such that a line connecting the second alignment marks 203A and 203B passes through the center 212 of the transfer destination region 210 and is parallel to any one of sides of the outer edge of the transfer destination region 210.

The second alignment marks 203 are formed on a metal layer where circuits are formed. The second alignment marks 203 are provided on the metal layer where the circuits are formed in the layered structure of the transfer destination substrate 200. The transfer destination substrate 200 can precisely provide positions of electrodes to be coupled to the light-emitting elements D with the positions of the second alignment marks 203. The second alignment marks 203 may be provided on any of the multiple metal layers included in the transfer destination substrate 200. The second alignment marks 203 may be formed on the metal layer where what is called a gate electrode layer or source electrode layer is formed, for example.

The light-emitting elements D are transferred to the transfer destination substrate 200. As a result, the display device 10 is formed. The display device 10 controls the multiple pixels to display images. The pixels each include light-emitting elements D that emit light in different colors. The display device 10 includes the pixels on the transfer destination substrate 200.

Figure 5A:
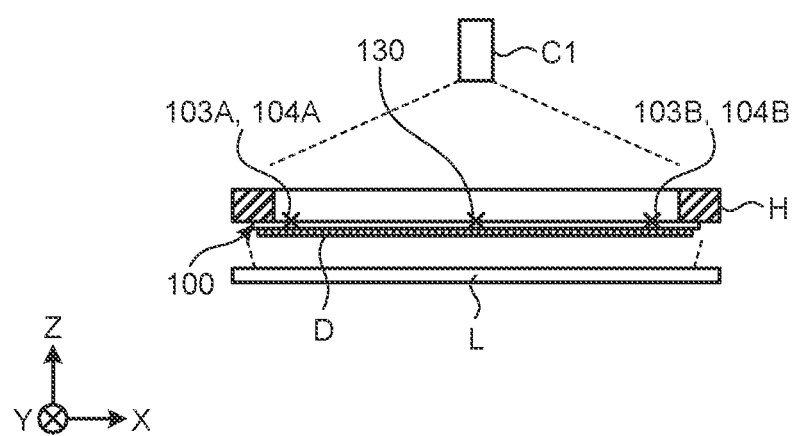
FIG. 5A is a conceptual diagram illustrating a step of obtaining a first reference position in a manufacturing method of the display device.
Figure 5B:
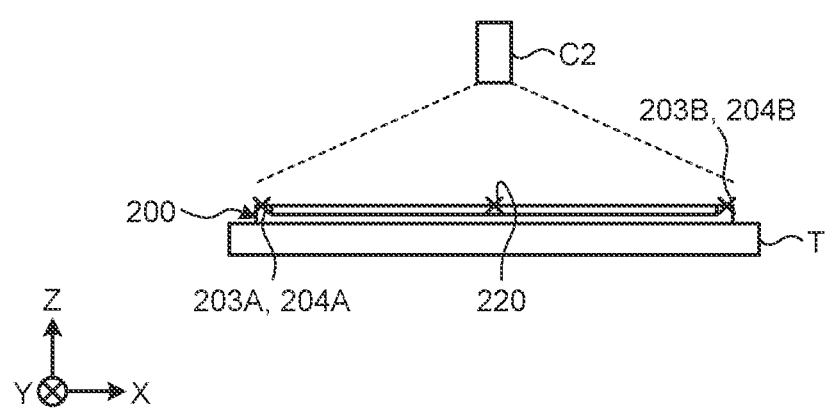
FIG. 5B is a conceptual diagram of a step of obtaining a second reference position in the manufacturing method of the display device.
Figure 5C:
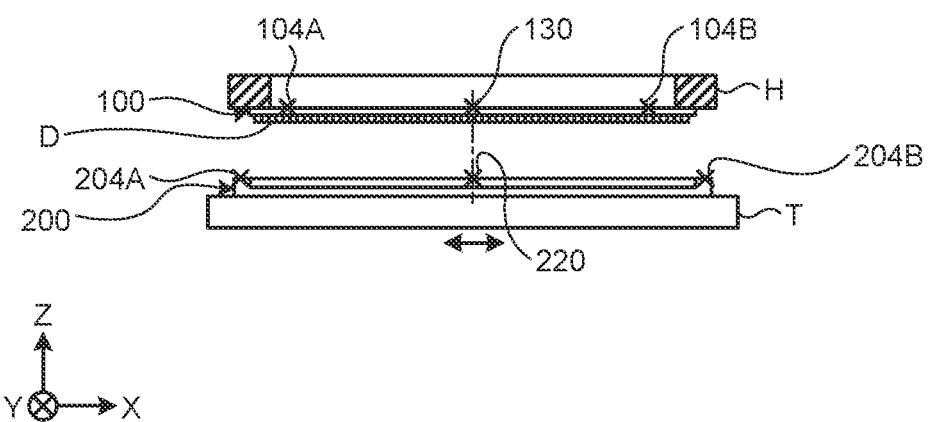
FIG. 5C is a conceptual diagram of a step of alignment in the manufacturing method of the display device.
Figure 5D:
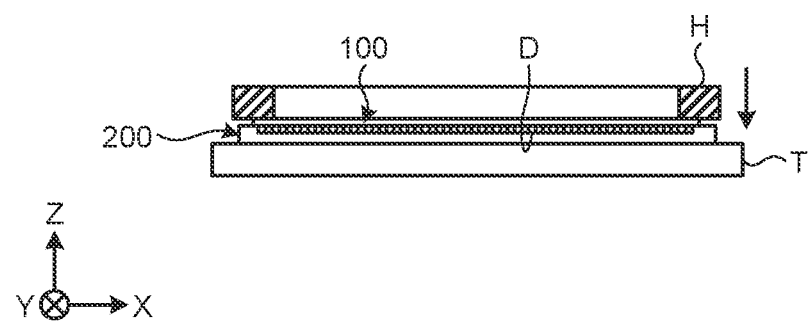
FIG. 5D is a conceptual diagram of a step of pressing the holding substrate onto a transfer destination substrate in the manufacturing method of the display device.
Figure 6:
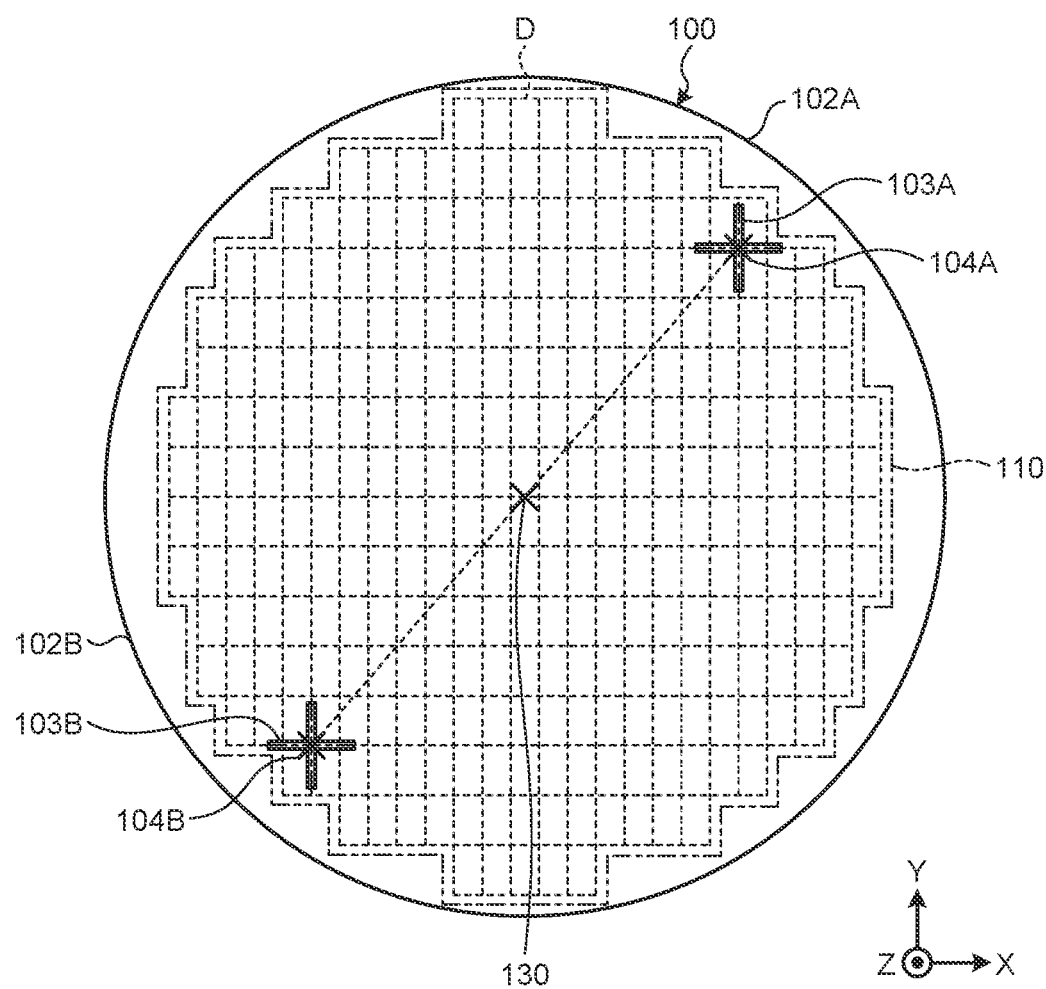
FIG. 6 is a conceptual plan view of the holding substrate according to the manufacturing method of the display device.
Figure 7:
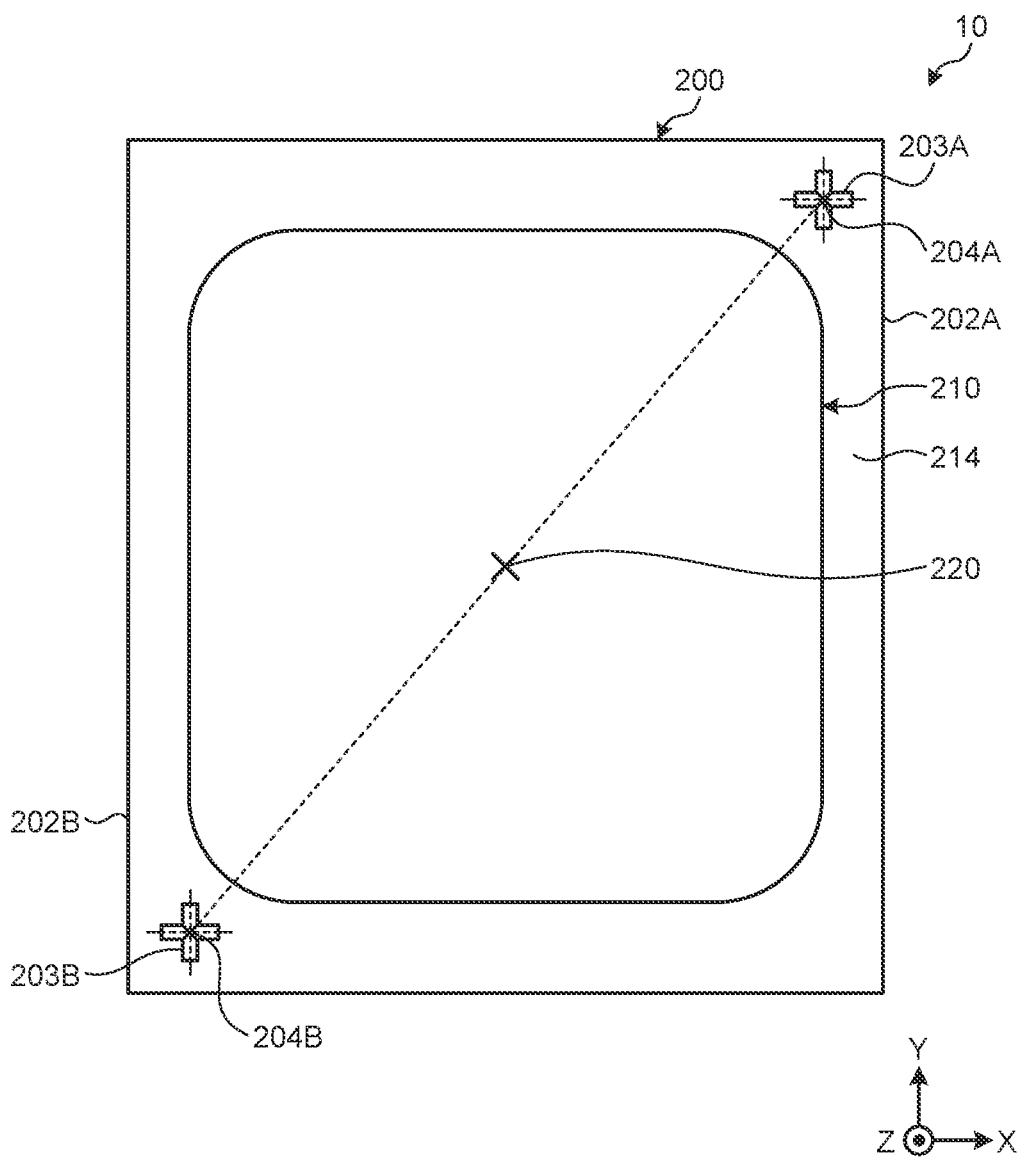
FIG. 7 is a conceptual plan view of the transfer destination substrate according to the manufacturing method of the display device.
Figure 8:
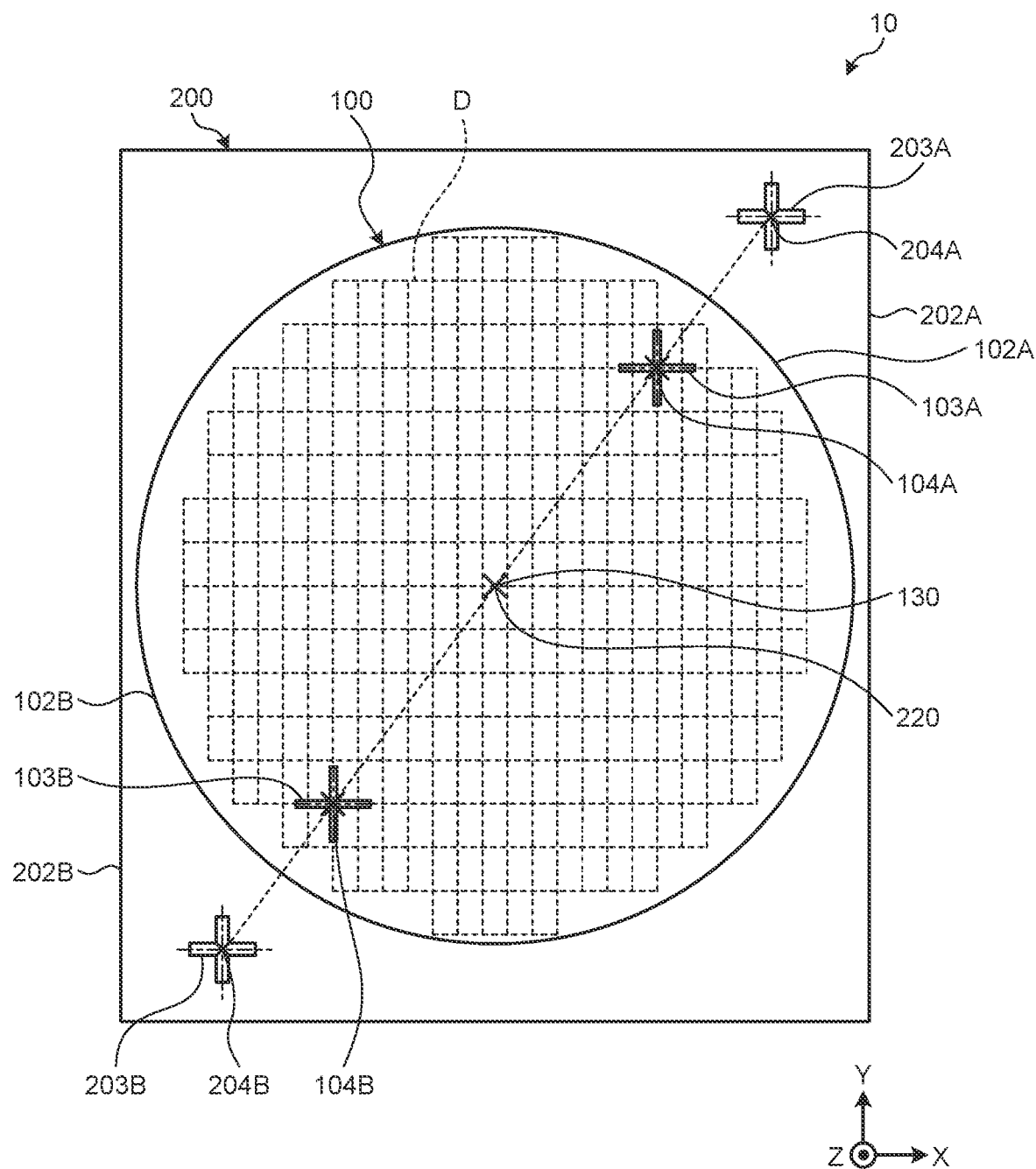
FIG. 8 is a conceptual plan view of a state in which the holding substrate and the transfer destination substrate according to the manufacturing method of the display device are aligned.

The pixels are arranged in a matrix having a row-column configuration. Each Pixel includes a light-emitting element that emits blue light, a light-emitting element that emits red light, and a light-emitting element that emits green light, for example. In the following description, the colors of light emitted by the light-emitting elements D are not specified.
Manufacturing Method of a Display Device According to the First Embodiment The following describes a manufacturing method of the display device according to the first embodiment with reference to FIGS. 5A to 8. FIG. 5A is a conceptual diagram illustrating a step of obtaining a first reference position in the manufacturing method of the display device. FIG. 5B is a conceptual diagram illustrating a step of obtaining a second reference position in the manufacturing method of the display device. FIG. 5C is a conceptual diagram illustrating a step of alignment in the manufacturing method of the display device. FIG. 5D is a conceptual diagram illustrating a step of pressing the holding substrate onto the transfer destination substrate in the manufacturing method of the display device. FIG. 6 is a conceptual plan view of the holding substrate according to the manufacturing method of the display device. FIG. 7 is a conceptual plan view of the transfer destination substrate according to the manufacturing method of the display device. FIG. 8 is a conceptual plan view of a state in which the holding substrate and the transfer destination substrate according to the manufacturing method of the display device are aligned. The manufacturing method of the display device includes the steps of obtaining the first reference position of the holding substrate, the step of obtaining the second reference position of the transfer destination substrate, and the step of aligning the holding substrate with the transfer destination substrate.

The manufacturing method of the display device is performed using an alignment device, which is not illustrated. The alignment device includes a camera C1, a camera C2, a light L, a handler H, a table T, and an image processor and a controller both of which are not illustrated. The camera C1 images the whole of a surface opposite to the surface provided with the first region 110 of the holding substrate 100. The camera C2 images the whole of a surface provided with the transfer destination region 210 of the transfer destination substrate 200. The light L emits light having a predetermined light amount to the first region 110 of the holding substrate 100. The light L may have a dimming function. As illustrated in FIG. 5A, the handler H can hold the holding substrate 100 in the air and can move it in the Z direction while holding the holding substrate 100 in the air. As illustrated in FIG. 5B, the table T can hold the transfer destination substrate 200 and can move in the X and Y directions while holding the transfer destination substrate 200. The table T holds the transfer destination substrate 200 in such an orientation that the transfer destination region 210 faces in the +Z direction. The table T is movable in the X axis and Y axis directions. The table T includes the handler H in its movable area. The table T may further be rotatable around the Z axis. The image processor performs predetermined image processing on the image data taken by the camera C1 and the image data taken by the camera C2. The controller controls each component of the alignment device.

As illustrated in FIG. 5A, the holding substrate 100 is held by the handler H such that the surface of the first region 110 faces the −Z direction. The holding substrate 100 held by the handler H is provided with the light L and the camera C1. The light L is arranged facing the surface of the holding substrate 100 that holds the light-emitting elements D. The camera C1 is arranged facing the surface of the holding substrate 100 opposite to the surface provided with the first region 110.

As illustrated in FIG. 5B, the transfer destination substrate 200 is held on the table T of the alignment device in such an orientation that the orthogonal direction of the surface of the transfer destination region 210 faces the +Z direction. The camera C2 is provided on the +Z direction side of the transfer destination substrate 200 held on the table T. The camera C2 images the transfer destination substrate 200 held on the table T. The image data taken by the camera C2 is sent to the image processor.

Step of Obtaining First Reference Position

As illustrated in FIG. 5A, at the step of obtaining the first reference position, the alignment device emits light having a predetermined light amount from the light L toward the first region 110 of the holding substrate 100, and images, by the camera C1, the holding substrate 100 irradiated with the light emitted from the light L. The image data taken by the camera C1 is sent to the image processor. The image processor processes the image data sent from the camera C1 to recognize the first alignment marks 103. As illustrated in FIG. 6, the image processor also obtains a first reference position 130 from the image data on the basis of the recognized first alignment marks 103.

Specifically, the alignment device emits light from the light L to the holding substrate 100 from the surface side of the first region 110 of the holding substrate 100. Light that is emitted from the light L and reaches the first sections 112 of the holding substrate 100 passes through the first surface 101 to the surface opposite the first surface 101. Light that is emitted from the light L and reaches the second sections 114 of the holding substrate 100 is reflected by the asperities of the protrusions 122 of the second surface 120 to be attenuated. As a result, light that is emitted from light L to the second sections 114 of the holding substrate 100 and passes through the first region 110 to the opposite side of the surface of the first region 110 is less in amount than light that is emitted to the first sections 112 of the holding substrate 100 and passes through the first region 110 to the opposite side of the surface of the first region 110. In other words, the light emitted from light L to the second sections 114 of the holding substrate 100 is blocked so that an amount of light passing through the first region 110 to the opposite side of the surface of the first region 110 is reduced to equal to or less than a predetermined light amount. The "predetermined light amount" is a pre-set light amount. Light that has passed through the first surface 101 to the surface opposite the first surface 101 is imaged by the camera C1 provided facing the surface opposite to the first surface 101.

The image processor recognizes portions corresponding to the first section 112A and the first section 112B as a first alignment mark 103A and a first alignment mark 103B, respectively, on the basis of the image data. The image processor divides the image data taken by the camera C1 into a plurality of image regions and obtains a luminance value for each image region. The image processor recognizes the image regions each having a luminance value equal to or greater than a predetermined luminance value as the first alignment marks 103 out of the obtained image regions, and obtains the first reference position 130. The predetermined luminance value is a pre-set luminance value. The image region corresponding to the first section 112 on the image data has a luminance value equal to or greater than the predetermined luminance value because light having a predetermined light amount passes through the image region, while the image region corresponding to the second section 114 on the image data has a lower luminance value than that of the image region corresponding to the first section 112. The image processor combines the image regions each having a luminance value equal to or greater than the predetermined luminance value in the image data, recognizes the first alignment mark 103 on the basis of the shape of the combined image regions, and obtains the coordinates of the position of the center 104 of the first alignment mark 103. More specifically, the image processor obtains the coordinates of the position of the center 104A of the shape of the image regions recognized as the first alignment mark 103A and the coordinates of the position of the center 104B of the shape of the image regions recognized as the first alignment mark 103B in the image data.

The image processor then obtains a specific position on the basis of the coordinates of the position of the center 104A of the first alignment mark 103A and the coordinates of the position of the center 104B of the first alignment mark 103B, to set the specific position as the first reference position 130. The specific position obtained by the image processor is an intermediate position between the coordinates of the center 104A of the first alignment mark 103A and the coordinates of the center 104B of the first alignment mark 103B, for example. In this case, the first reference position 130 is obtained within the first region 110. The image processor obtains the coordinates of the obtained first reference position 130. The image processor may obtain the coordinates of the obtained first reference position 130 in the X direction and Y direction in the alignment device. The first reference position 130 is not limited to a single point, but may be multiple points at different positions.

Step of Obtaining Second Reference Position

As illustrated in FIG. 5B, at the step of obtaining the second reference position, the alignment device takes images by the camera C2. As illustrated in FIG. 7, the image processor performs image processing on the image data taken by the camera C2 to recognize the second alignment marks 203. The image processor also obtains the coordinates of the positions of the centers 204 of the recognized second alignment marks 203. The image processor also obtains a second reference position 220 on the basis of the coordinates of the positions of the centers 204 of the obtained second alignment marks 203. It does not matter whether the step of obtaining the second reference position is before or after the step of obtaining the first reference position in chronological order. The step of obtaining the second reference position and the step of obtaining the first reference position may be performed at the same time.

Specifically, at the step of obtaining the second reference position, the alignment device images the transfer destination substrate 200 by the camera C2. On the basis of the image data taken by the camera C2, the image processor obtains the coordinates of the position of the center 204A of the second alignment mark 203A provided adjacent to an edge 202A of the transfer destination substrate 200, and the coordinates of the position of the center 204B of the second alignment mark 203B provided adjacent to an edge 202B of the transfer destination substrate 200. The image processor obtains a specific position on the basis of the coordinates of the position of the center 204A of the second alignment mark 203A, and the coordinates of the position of the center 204B of the second alignment mark 203B to set the specific position as the second reference position 220. The specific position obtained by the image processor is an intermediate position between the coordinates of the center 204A of the second alignment mark 203A and the coordinates of the center 204B of the second alignment mark 203B. The image processor obtains the coordinates of the obtained second reference position 220. The image processor may obtain the coordinates of the obtained second reference position 220 in the X direction and Y direction in the alignment device. The second reference position 220 is not limited to a single point, but may be multiple points at several different positions.

Step of Alignment

As illustrated in FIG. 5C, at the step of alignment, the alignment device performs alignment by moving the table T holding the transfer destination substrate 200 in the X and Y directions such that the holding substrate 100 and the transfer destination substrate 200 coincide with each other. Specifically, the alignment device obtains a difference in the X direction and a difference in the Y direction between the obtained coordinates of the first reference position 130 of the holding substrate 100 and the obtained coordinates of the second reference position 220 of the transfer destination substrate 200. The alignment device then moves the table T by the amount of the obtained differences in the X and Y directions to make the second reference position 220 of the transfer destination substrate 200 coincide with the first reference position 130 of the holding substrate 100.

Step of Pressing Holding Substrate to Transfer Destination Substrate

As illustrated in FIG. 5D, the alignment device moves the handler H in the −Z direction after alignment of the holding substrate 100 with the transfer destination substrate 200. The holding substrate 100 held by the handler H is lowered to the position of the transfer destination substrate 200 to press the light-emitting elements D held on the second surface 120 against the transfer destination region 210 of the transfer destination substrate 200 with a predetermined load in the −Z direction. The light-emitting elements D are pressed against the transfer destination substrate 200. As a result, the light-emitting elements D come into contact with a plurality of electrodes provided on the transfer destination substrate 200 with low melting point metal members therebetween.

In the manufacturing method of the display device, the holding substrate 100 is further irradiated with heating laser beams of a predetermined wavelength from a heating laser device (not illustrated) provided facing the surface opposite to the first surface 101, while the holding substrate 100 is pressed against the transfer destination substrate 200. As a result, the low-melting point metal members in the transfer destination region 210 of the transfer destination substrate 200, which absorbs the irradiated heating laser beams, melt and connect the light-emitting elements D held on the holding substrate 100 and the electrodes on the transfer destination substrate 200. In the manufacturing method of the display device, the holding substrate 100 is irradiated with ablation laser beams from an ablation laser device provided facing the surface opposite to the first surface 101 of the holding substrate 100, after the irradiation with the heating laser beams. The interfacial surface portion of the light-emitting element D, which has absorbed the irradiated ablation laser beams, on the side adjacent to an interfacial surface between the light-emitting element D and the second surface 120 is transformed, causing the second surface 120 and the light-emitting element D to be detached. In this way, the light-emitting elements D held on the holding substrate 100 are transferred to the transfer destination substrate 200 by the manufacturing method of the display device.

Modification

Figure 9:
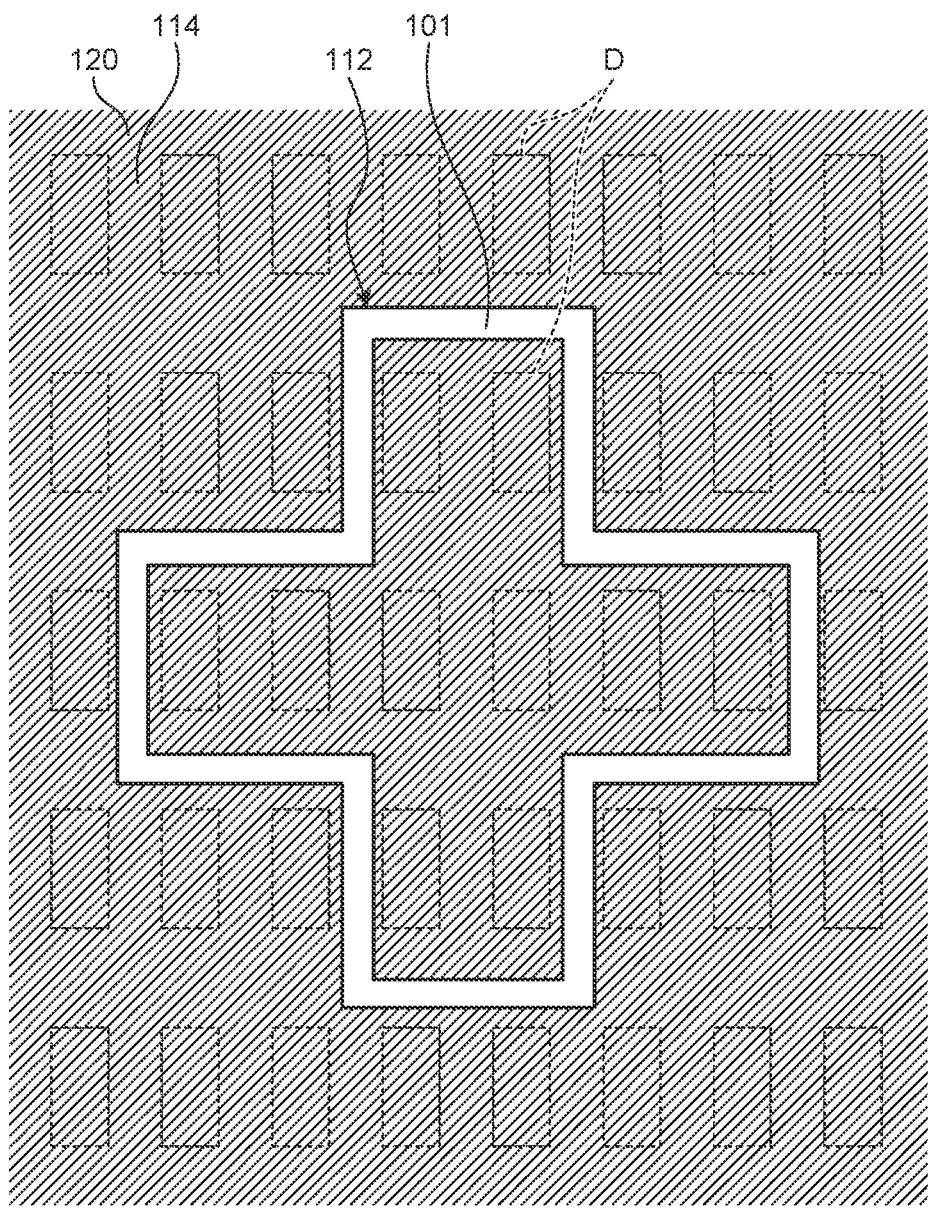
FIG. 9 is a detailed view of a main portion of the holding substrate according to a modification.

FIG. 9 is a detailed view of a main portion of the holding substrate according to a modification. As illustrated in FIG. 9, the first section 112 of the holding substrate 100 may surround the second sections 114. In this case, the first section 112 is formed in the gaps between the second sections 114 so as to surround the second sections 114 in a cruciform shape with the center 116 when viewed from the +Z direction. This increases the area surrounded by the first section 112, making it easier for the camera C1 to recognize the first alignment mark 103 formed by the light that is emitted from the light L illustrated in FIG. 5A and passes through the first surface 101. Furthermore, the first section 112 may be surrounded by the second sections 114. This makes it easier for the camera C1 to recognize the difference between the luminance in the image region corresponding to the first section 112 and the luminance in the image region corresponding to the second sections 114 in the image data of the holding substrate 100 taken when it is irradiated with light of light L. As a result, the coordinates of the position of the center 104 of the first alignment mark 103 can be obtained with higher accuracy. The shape of the first section 112 viewed from the +Z direction is not limited to a cruciform shape, but may be polygonal, such as circular, triangular, quadrangular, or hexagonal. The shape of the first section 112 viewed from the +Z direction may be a combination of multiple shapes.

As explained above, the manufacturing method of the display device includes the step of obtaining the first reference position on the surface of the holding substrate 100 on the basis of the positions of the first alignment marks 103 of the holding substrate 100, the step of obtaining the second reference position 220 on the surface of the transfer destination substrate 200 on the basis of the positions of the second alignment marks 203 of the transfer destination substrate 200, and the step of aligning the holding substrate 100 with the transfer destination substrate 200 such that the first reference position 130 and the second reference position 220 coincide with each other. The holding substrate 100 is sectioned into the first sections 112 and the second sections 114 when viewed from the +Z direction. The second sections 114 are arranged at predetermined intervals when viewed from the +Z direction. The first section 112 is provided in a part of the gaps between the second sections 114 when viewed from the +Z direction. The first section 112 has a light transmission rate higher than that of the second section 114. The first section 112 forms the first alignment mark 103 through which light passes when viewed from the +Z direction.

The holding substrate 100 has the first sections 112, which serve as the first alignment marks 103 and have a light transmission rate higher than that of the second sections 114, and the second sections 114. This makes it possible to recognize light that has a predetermined light amount and passes through the first sections 112 on the first surface 101 as the first alignment marks 103. The first sections 112 forming the first alignment marks 103 of the holding substrate 100 are each provided in a part of the gaps between the second sections 114 for holding the light-emitting elements D. Unlike conventional techniques, the second sections 114 serving as the region in which the light-emitting elements D are to be held do not include the first alignment marks 103. As a result, the quantity of light-emitting elements D held by the holding substrate 100 can be increased. The holding substrate 100 does not include the first alignment mark 103 in the second sections 114, which serve as the region in which the light-emitting elements D are to be held. This eliminates a process to transfer the light-emitting elements D to the region where the second alignment mark 203 is provided on the transfer destination substrate 200 for a supplement after the light-emitting elements D are transferred from the holding substrate 100 to the transfer destination substrate 200 in the manufacturing process of the display device.

The first section 112 may be surrounded by the second sections 114.

This structure, in which the first section 112 is surrounded by the second sections 114, makes more clear the difference between the luminance in the region corresponding to the first section 112 and the luminance in the region corresponding to the second sections 114 on the surface side of the first region 110 when light is emitted from the surface side of the first region 110 of the holding substrate 100. As a result, the recognizability of the first section 112 can be improved.

The first section 112 may surround the second sections 114.

With this configuration, the first section 112 surrounds at least one of the second sections 114 when viewed from the +Z direction, thereby causing the region surrounded by the first section 112 to have a larger area. As a result, the recognizability of the first section 112 can be improved.

The second sections 114 are arranged in a grid pattern when viewed from the +Z direction, and the first section 112 may be provided in a part of the grid lines formed by the gaps between the second sections 114.

This structure, in which the first section 112 is provided in a part of the grid lines formed by the gaps between the second sections 114 arranged in a grid pattern, allows the first section 112 to have a shape and a size along the grid lines regardless of the shape and size of the second section 114.

The first section 112 has the first surface 101 and the second section 114 has the second surface 120 when viewed from the +Z direction. The second surface 120 may have asperities larger than those of the first surface 101.

This structure, in which the second surface 120 of the second section 114 have asperities larger than those of the first surface 101 of the first section 112, allows the second surface 120 to have a high light reflection rate of light from the orthogonal direction of the second surface 120. As a result, a light transmission rate of light passing between the second surface 120 and the opposite surface of the second surface 120 is low. The second section 114, which has a high light reflection rate of light from the orthogonal direction of the second surface 120, can reflect light from the orthogonal direction of the second surface 120 in a direction other than the orthogonal direction of the second surface 120.

The first sections 112 and the second sections 114 of the holding substrate 100 may be provided in the first region 110 of the holding substrate 100, and the first reference position 130 of the holding substrate 100 may be obtained in the first region 110.

As a result, the holding substrate 100 obtains the first reference position 130 in the first region 110 of the holding substrate 100. This allows the alignment between the holding substrate 100 and the transfer destination substrate 200 by aligning the first reference position 130 with the second reference position 220 of the transfer destination substrate 200. Furthermore, when the holding substrate 100 obtains the first reference position 130 in the first region 110, it is possible for the position of the light-emitting elements D in the first region 110 to serve as the first reference position 130 and to be aligned with the second reference position 220 of the transfer destination substrate 200.

The holding substrate 100 is sectioned into the first sections 112 and the second sections 114 when viewed from the +Z direction. The first section 112 is provided in a part of the gaps between the second sections 114 when viewed from the +Z direction. The first section 112 has a light transmission rate higher than that of the second section 114. The first section 112 forms the first alignment mark 103.

The holding substrate 100 includes the first sections 112 having a light transmission rate higher than that of the second sections 114, and the second sections 114. This makes it possible to recognize light that has a predetermined light amount and passes through the first section 112 of the first surface 101 as the first alignment mark 103. The first sections 112 forming the first alignment marks 103 of the holding substrate 100 are each provided in a part of the gaps between the second sections 114 for holding the light-emitting elements D. Unlike conventional techniques, the first alignment marks 103 are not provided in the second sections 114, which serve as the region in which the light-emitting elements D are to be held. As a result, the quantity of the light-emitting elements D held by the holding substrate 100 can be increased. As described above, the holding substrate 100 does not include the first alignment marks 103 in the second sections 114, which serve as the region in which the light-emitting elements D are to be held. This eliminates a process to transfer the light-emitting elements D to the region where the second alignment marks 203 are provided on the transfer destination substrate 200 for a supplement after the light-emitting elements D are transferred from the holding substrate 100 to the transfer destination substrate 200 in the manufacturing process of the display device.

What is disclosed herein is not limited to the embodiment described above. The content disclosed in the embodiment is only an example, and various changes can be made without departing from the purpose of the disclosure. Any modification made without departing from the purpose of the disclosure naturally belongs to the technical scope of the disclosure.

For example, the transfer destination substrate may have a transfer destination region larger than the first region 110 of the holding substrate 100. When the transfer destination region includes a plurality of regions corresponding to the size of the first region 110, the second alignment marks are provided for each region corresponding to the size of the first region 110 in the peripheral region of the transfer destination substrate, and the second reference position is obtained on the basis of the second alignment marks provided for each region corresponding to the size of the first region 110.

What is claimed is:

1. A manufacturing method of a display device, the method comprising:

forming an inorganic light emitting diode on a holding substrate;

obtaining a first reference position on a surface of a holding substrate based on positions of a plurality of first alignment marks of the holding substrate; and aligning the holding substrate with a transfer destination substrate such that the first reference position on the holding substrate and a second reference position on a surface of the transfer destination substrate coincide, wherein the holding substrate is sectioned into a plurality of first sections and a plurality of second sections when viewed from one direction, each of the first sections is provided in a part of a gap between the second sections when viewed from the one direction, has a light transmission rate higher than a light transmission rate of the second sections, and forms the first alignment mark through which light passes when viewed from the one direction, each of the first sections has a first surface, and each of the second sections has a second surface, when viewed from the one direction, the first surface is a smooth surface, the second surface has a first region pattern of asperities and includes:
 a first region on which the inorganic light emitting diode is held, the first region including the first sections and the second sections; and
 a second region on which the inorganic light emitting diode is not held, and a surface of the inorganic light emitting diode has the first region pattern of asperities, each of the first sections are in direct contact with corresponding ones of the second sections each having the first region pattern of asperities when viewed from the one direction, and none of the first sections is in direct contact with the second region on which the inorganic light emitting diode is not held, the second region having the first region pattern of asperities, when viewed from the one direction.

2. The manufacturing method of a display device according to claim 1, wherein each of the first sections is surrounded by the second sections.

3. The manufacturing method of a display device according to claim 1, wherein each of the first sections surrounds the second sections.

4. The manufacturing method of a display device according to claim 1, wherein
the second sections are arranged in a grid pattern when viewed from the one direction, and
each of the first sections is provided in a part of grid lines formed by gaps between the second sections arranged in a grid pattern.

5. The manufacturing method of a display device according to claim 1, wherein
the second surface has asperities having a height difference larger than a height difference of the first section.

6. The manufacturing method of a display device according to claim 1, wherein
the first reference position of the holding substrate is obtained in the first region.

7. The manufacturing method of a display device according to claim 6, wherein
the transfer destination substrate includes a transfer destination region corresponding to the first region of the holding substrate and a plurality of second alignment marks outside the transfer destination region, and
the second reference position is obtained based on the second alignment marks.

* * * * *